(12) United States Patent
Hung et al.

(10) Patent No.: US 9,076,754 B2
(45) Date of Patent: *Jul. 7, 2015

(54) 3DIC PACKAGES WITH HEAT SINKS ATTACHED TO HEAT DISSIPATING RINGS

(71) Applicant: Taiwan Semiconductor Manufacturing Company, Ltd., Hsin-Chu (TW)

(72) Inventors: Wensen Hung, Zhubei (TW); Szu-Po Huang, Taichung (TW); Kim Hong Chen, Fremont, CA (US); Shin-Puu Jeng, Hsin-Chu (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/144,691

(22) Filed: Dec. 31, 2013

(65) Prior Publication Data

US 2015/0035135 A1 Feb. 5, 2015

Related U.S. Application Data

(63) Continuation-in-part of application No. 13/957,727, filed on Aug. 2, 2013.

(51) Int. Cl.
  *H01L 23/10* (2006.01)
  *H01L 23/367* (2006.01)
  *H01L 23/34* (2006.01)
(52) U.S. Cl.
  CPC .......... *H01L 23/3672* (2013.01); *H01L 23/34* (2013.01)

(58) Field of Classification Search
  CPC .................. H01L 25/0657; H01L 2023/405
  USPC ............ 257/E21.511, E23.08, E23.085, 712, 257/713, 686, 706; 438/106
  See application file for complete search history.

(56) References Cited

U.S. PATENT DOCUMENTS

| | | | |
|---|---|---|---|
| 5,548,482 | A | 8/1996 | Hatauchi et al. |
| 7,592,697 | B2 | 9/2009 | Arana et al. |
| 2009/0057881 | A1 | 3/2009 | Arana et al. |
| 2009/0283902 | A1 | 11/2009 | Bezama et al. |
| 2011/0018125 | A1 | 1/2011 | Loo et al. |
| 2011/0147916 | A1 | 6/2011 | Su |
| 2012/0049341 | A1 | 3/2012 | Bezama et al. |

(Continued)

OTHER PUBLICATIONS

Ajami, Amir H., et al. "Modeling and Analysis of Nonuniform Substrate Temperature Effects on Global ULSI Interconnects," IEEE Transactions on Computer-Aided Design of Integrated Circuits and Systems, vol. 24, No. 6, Jun. 2005, 13 pages.

(Continued)

*Primary Examiner* — Telly Green
(74) *Attorney, Agent, or Firm* — Slater & Matsil, L.L.P.

(57) ABSTRACT

A package includes a first die and a second die underlying the first die and in a same first die stack as the first die. The second die includes a first portion overlapped by the first die, and a second portion extending beyond edges of the first die. A first Thermal Interface Material (TIM) is overlying and contacting a top surface of the first die. A heat sink has a first bottom surface over and contacting the first TIM. A second TIM is overlying and contacting the second portion of the second die. A heat dissipating ring is overlying and contacting the second TIM.

20 Claims, 13 Drawing Sheets

(56) References Cited

U.S. PATENT DOCUMENTS

2014/0061893 A1 3/2014 Saeidi et al.
2014/0217575 A1 8/2014 Hung

OTHER PUBLICATIONS

De Orio, R.L., et al., "Physically based models of electromigration: From Black's equation to modern TCAD models," Elsevier Ltd., Microelectronics Reliability, 50, Mar. 2010, pp. 775-789.

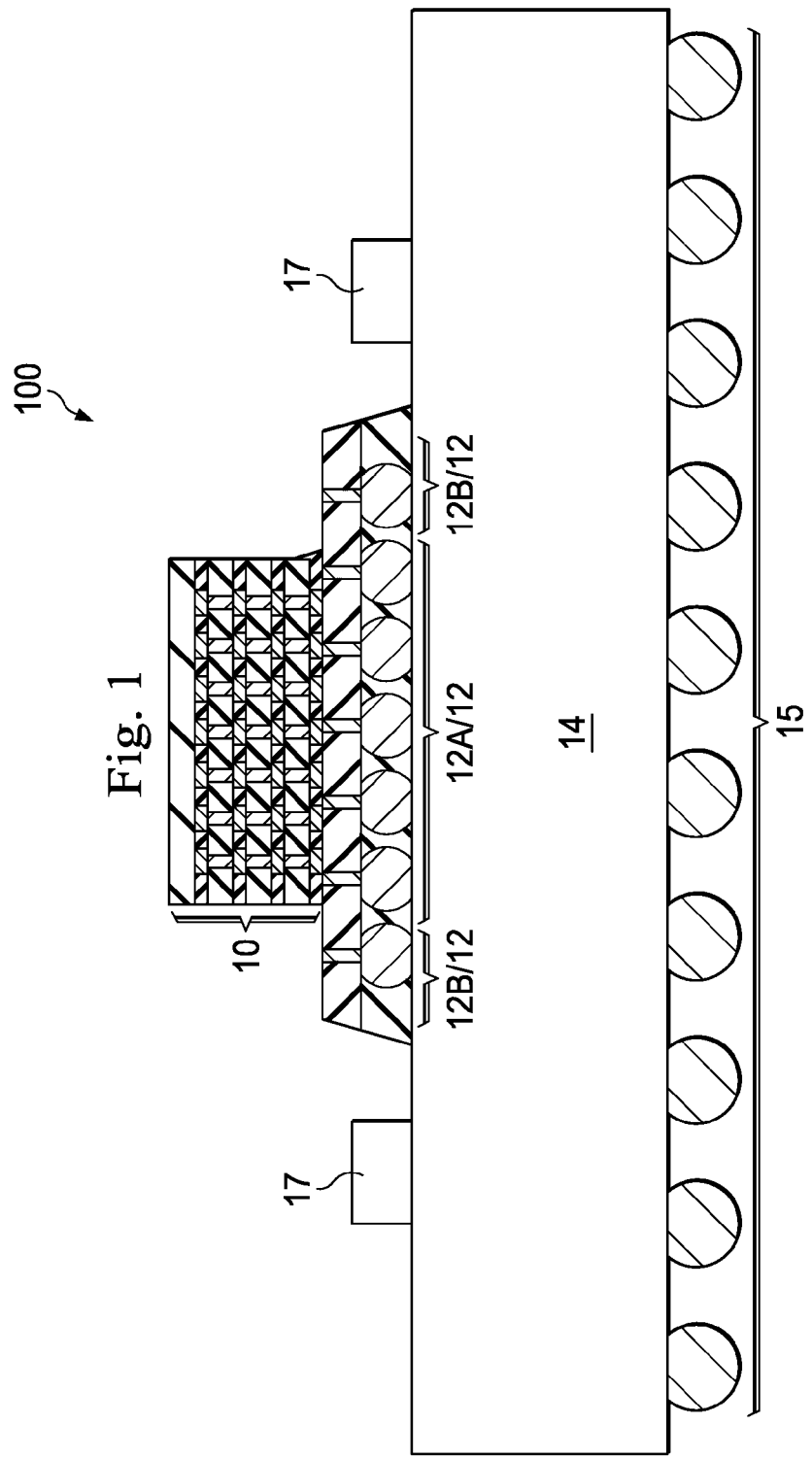

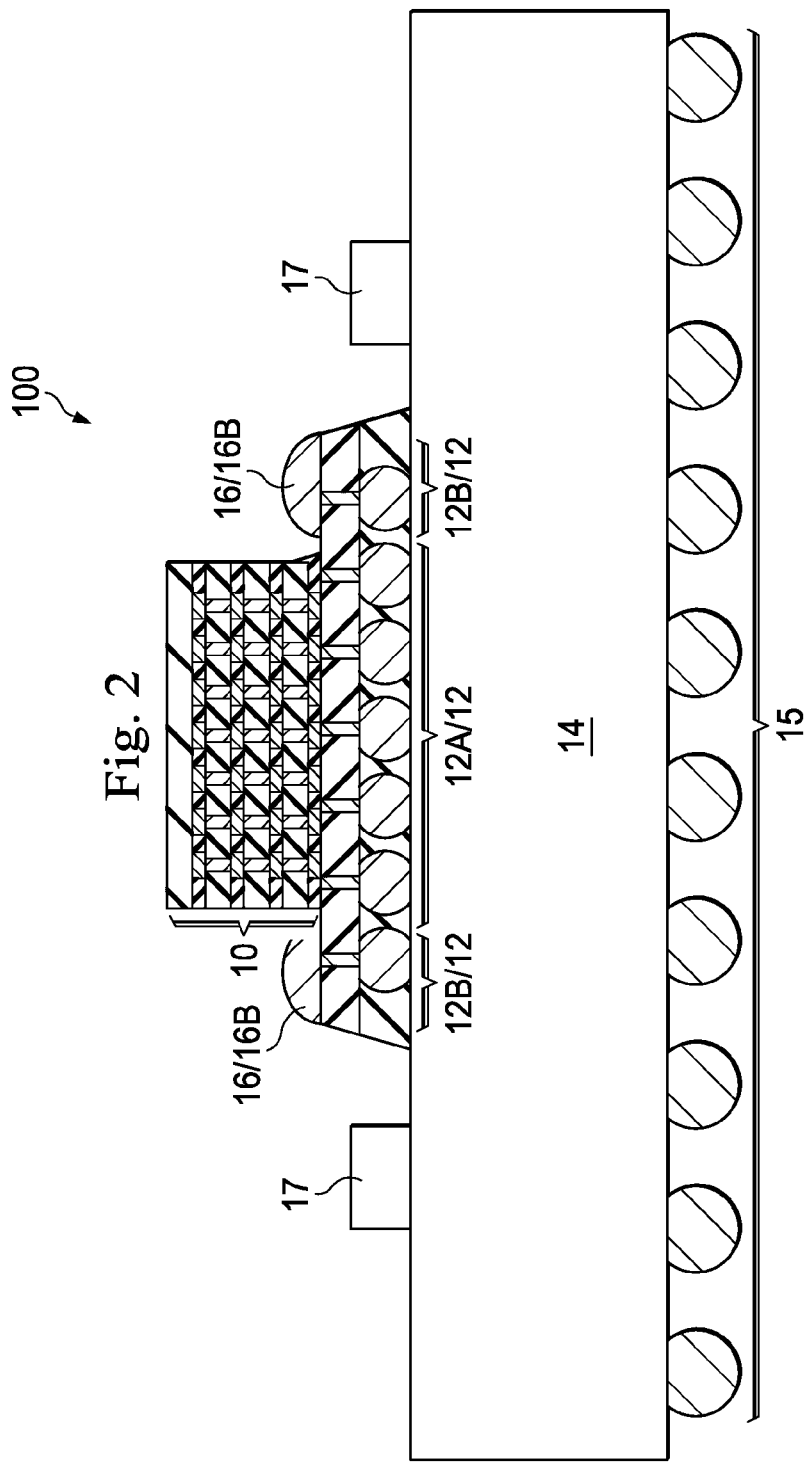

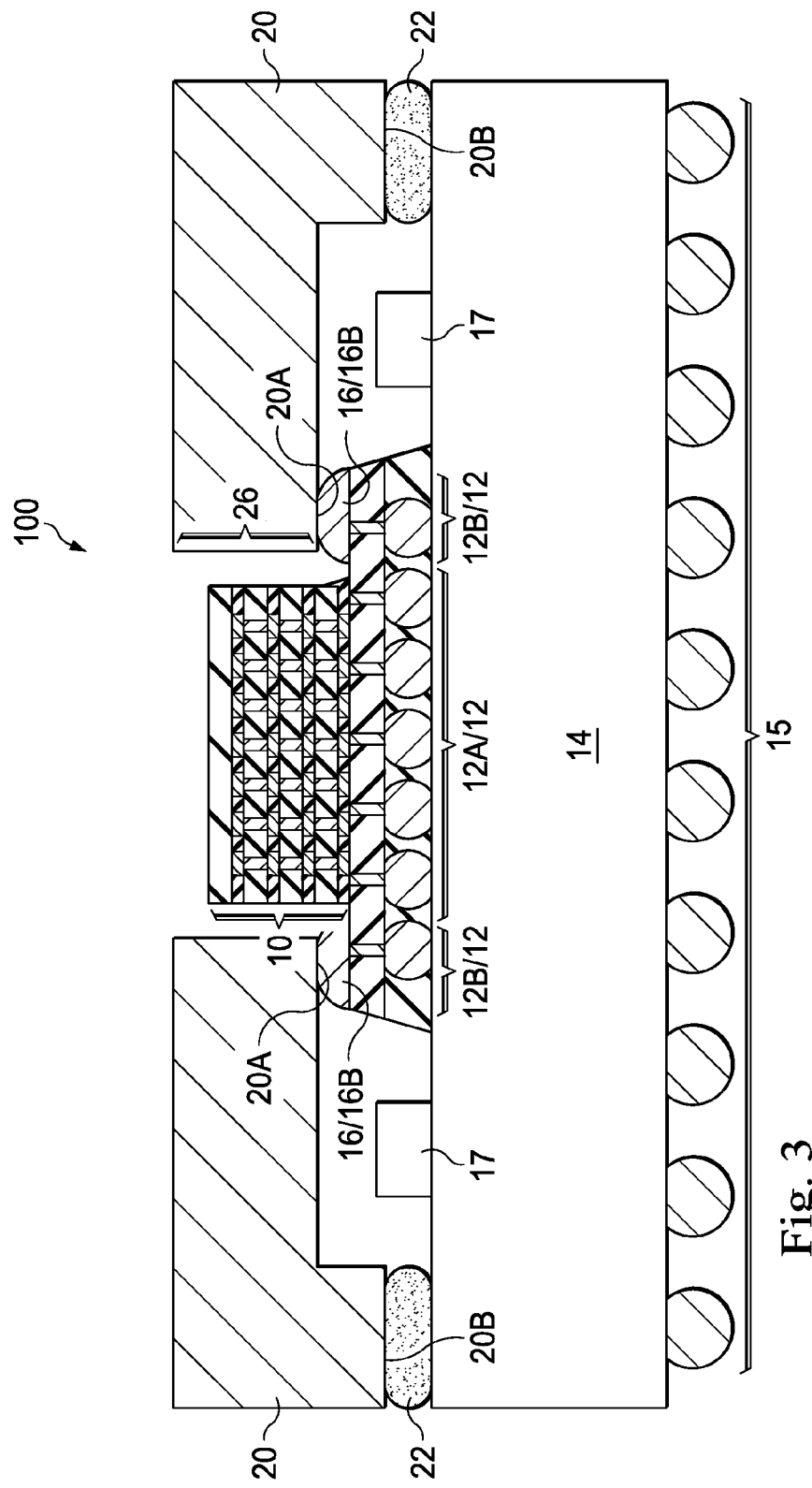

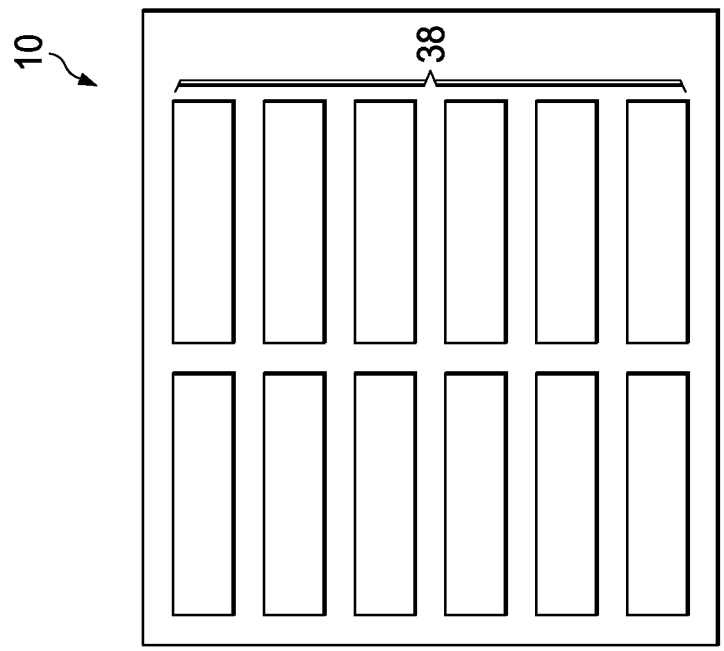
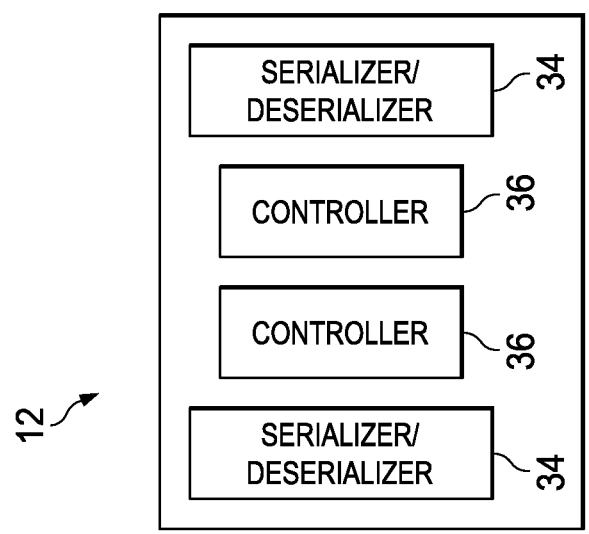

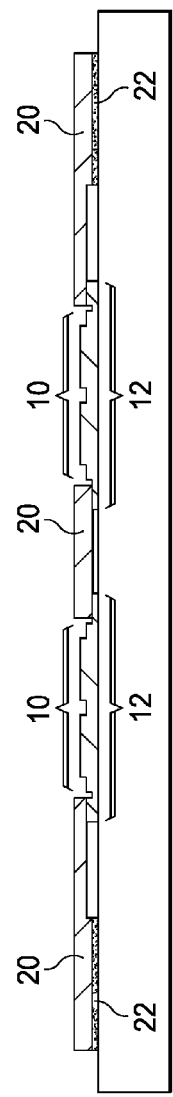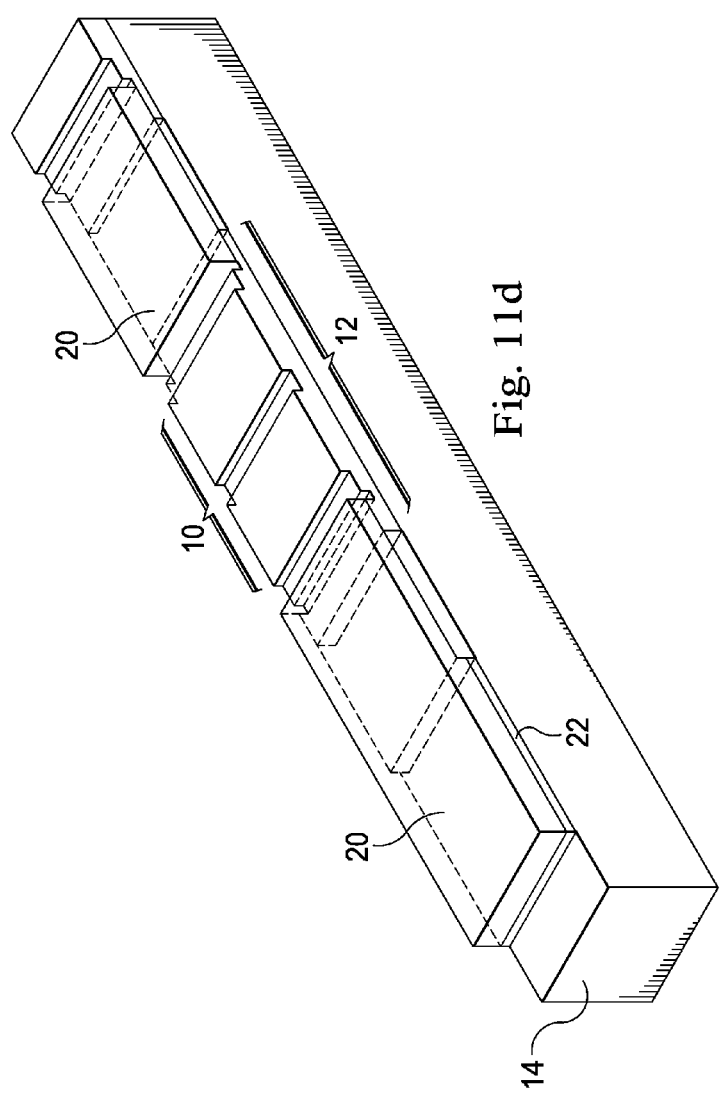

3DIC PACKAGES WITH HEAT SINKS ATTACHED TO HEAT DISSIPATING RINGS

CROSS REFERENCE

This application is a Continuation-In-Part (CIP) application of the following commonly-assigned U.S. patent application: application Ser. No. 13/957,727, filed Aug. 2, 2013, and entitled "3DIC Packages with Heat Dissipation Structures;" which application is hereby incorporated herein by reference.

BACKGROUND

In the packaging of integrated circuits, semiconductor dies may be stacked through bonding, and may be bonded to other package components such as interposers and package substrates. The resulting packages are known as Three-Dimensional Integrated Circuits (3DICs). The heat dissipation is a challenge in the 3DICs. There exists a bottleneck in efficiently dissipating the heat generated in the inner dies of the 3DICs. The heat generated in the inner dies has to be dissipated to outer components such as outer dies before the heat can be conducted to any heat spreader. Between the stacked dies, however, there exist other materials such as underfill, molding compound, etc, which are not effective in conducting heat. Furthermore, the stacked dies may also be molded in a molding compound, which prevents the efficient heat dissipation.

In a conventional package, a die stack including a plurality of dies may be stacked on a bottom die having a size larger than the die stack. The bottom die is further attached to a package substrate. A conformal metal lid is formed to cover the bottom die, and to encircle and cover the die stack. The conformal metal lid is attached to both the top surface of the edge portions of the logic die and the top surface of the die stack through Thermal Interface Materials (TIM). A heat sink is further attached to the top surface of the conformal metal lid through another TIM.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 4B are cross-sectional views of intermediate stages in the formation of a package in accordance with some exemplary embodiments;

FIGS. 5A and 5B illustrate the floor plans of a logic die and a memory die for performing a simulation;

FIGS. 11B, 11C, and 11D illustrate a cross-sectional view and perspective views of the heat dissipating ring packaged with die stacks and a package substrate;

DETAILED DESCRIPTION OF ILLUSTRATIVE EMBODIMENTS

Figure 4A:
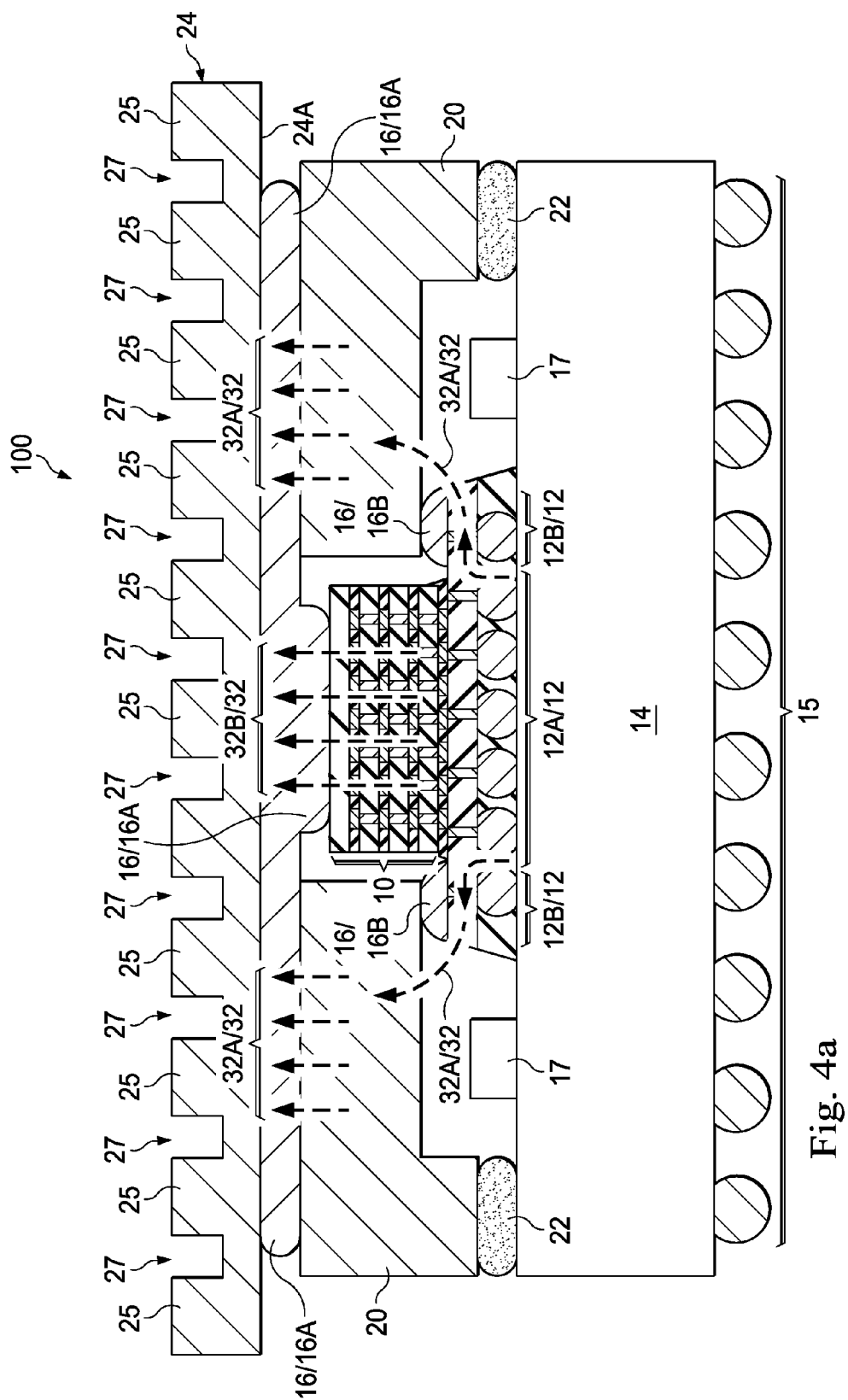

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package with improved heat dissipating ability and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

FIG. 1 illustrates the cross-sectional view of an initial stage in the formation of Three-Dimensional Integrated Circuit (3DIC) package 100, which includes dies 10 stacked on die 12. Throughout the description, dies 10 are also referred to as die stack 10. In some embodiments, dies 10 are memory dies that form a memory stack. In alternative embodiments, dies 10 are logic dies. In yet alternative embodiments, dies 10 include both logic dies and memory dies. Die 12 may be a logic die, which may further be a Central Processing Unit (CPU), a Graphics Processing Unit (GPU), or the like. Dies 10 and 12 may be bonded through flip chip bonding, wherein metal bumps, solder balls, or the like are used to bond dies 10 and 12.

Die 10 has a top view size smaller than the top view size of dies 12. As shown in FIG. 1, die 12 may extend laterally beyond dies 10, and may include portion 12A that is overlapped by dies 10, and portions 12B that are not overlapped by dies 10. The die stack including dies 10 and 12 are further bonded to package component 14, which may be a package substrate, an interposer, a Printed Circuit Board (PCB), or the like. Discrete passive devices 17 such as resistors, capacitors, transformers, and the like, may also be bonded to package component 14. Solder balls 15 are attached to package component 14, wherein dies 10/12 and solder balls 15 are on opposite sides of package component 14.

Next, referring to FIG. 2, Thermal Interface Material (TIM) 16 is dispensed on Die 12. The illustrated TIM 16 is also referred to as TIM portions 16B, which are also dispensed on, and may be in physical contact with, the top surfaces of portions 12B of die 12. TIM 16 has a good thermal conductivity, which may be higher than about 2 W/m*K, and may be as equal to, or higher than, about 10 W/m*K or 50 W/m*K. TIM portions 16B may, or may not, form a ring. In accordance with some embodiments, when forming the ring, TIM portions 16B encircle dies 10.

FIG. 3 illustrates the attachment of heat dissipation ring 20 to package component 14. Heat dissipation ring 20 has a high thermal conductivity higher than about 100 W/m*K, for example, and may be formed using a metal, a metal alloy, or the like. For example, heat dissipation ring 20 may comprise metals and/or metal alloys selected from the group consisting of Al, Cu, Ni, Co, and the like. Heat dissipation ring 20 may also be formed of a composite material selected from the group consisting of silicon carbide, aluminum nitride, graphite, and the like. Heat dissipation ring 20 includes a first bottom surface(s) 20A contacting TIM portion 16B, and a second bottom surface(s) 20B adhered to package component 14 through adhesive 22. Adhesive 22 may have a better adhering ability and a lower thermal conductivity than TIM 16. For example, adhesive 22 may have a thermal conductivity lower than about 0.5 W/m*K. In the embodiments throughout the description, heat dissipating ring 20 forms a ring encircling opening 26, in which dies 10 are disposed. In alternative embodiments, as shown in FIG. 11A through 13, heat dissipating ring 20 comprises a plurality of openings encircled by different portions of heat dissipating ring 20.

Figure 4B:
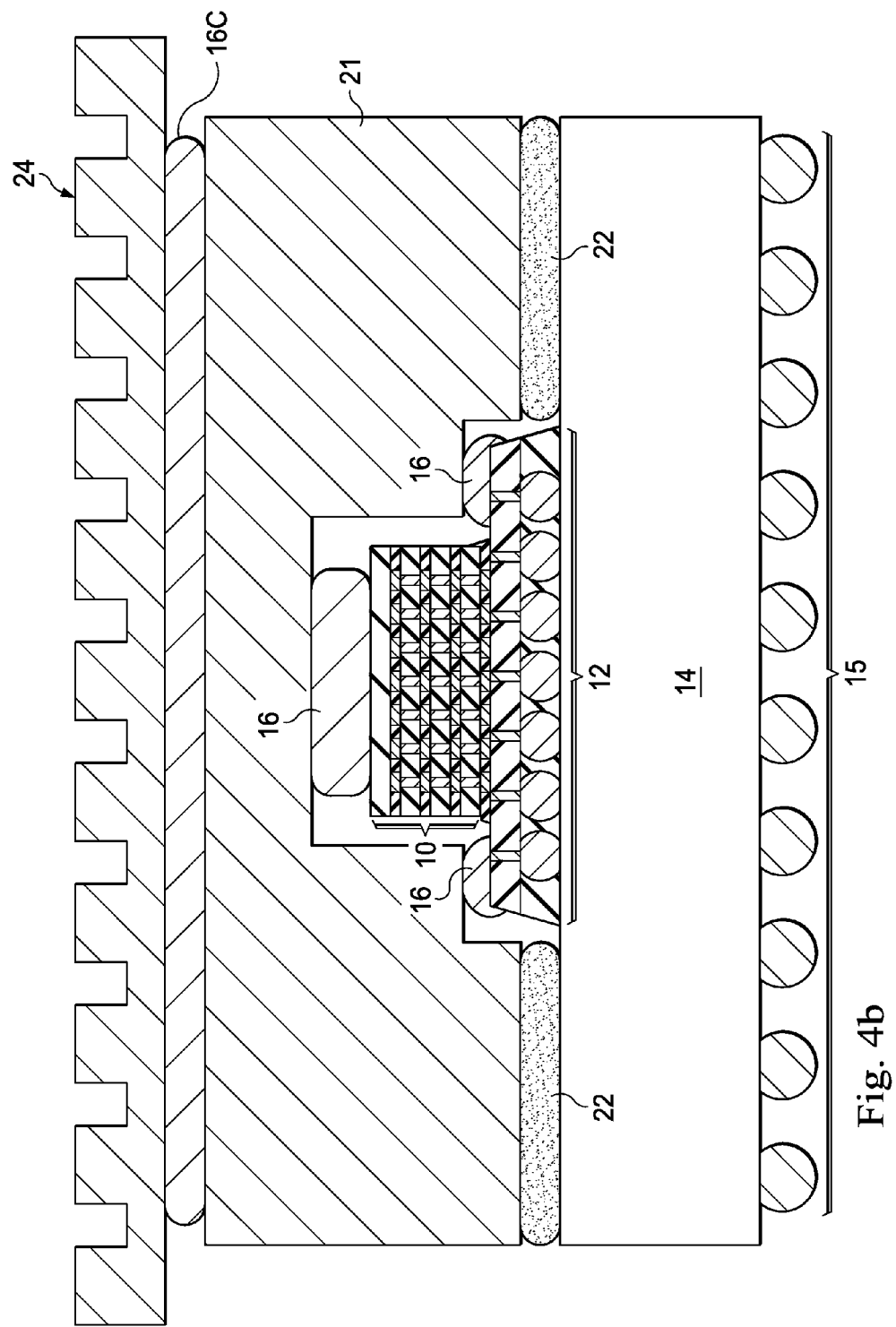

Next, referring to FIGS. 4a and 4b, heat sink 24 is attached to the top surface of die stack 10 and heat sink 24 through TIM 16A, which is also sometimes referred to as TIM 16. Heat sink 24 includes bottom surface 24A, to which TIM 16A is attached. Bottom surface 24A may be planar in entirety in some embodiments. Heat sink 24 has a high thermal conductivity higher than about 100 W/m*K, for example, and may be formed using a metal, a metal alloy, or the like. For example, heat sink 24 may comprise metals and/or metal alloys selected from the group consisting of Al, Cu, Ni, Co, and the like. Heat sink 24 may also be formed of a composite material selected from the group consisting of silicon carbide, aluminum nitride, graphite, and the like. Heat sink 24 includes a plurality of fins 25, with a plurality of trenches 27 separating the plurality of fins 25. In some embodiments, fins 25 have a top-view shape of a plurality of parallel strips. In alternative embodiments, in the top view of heat sink 24, trenches 27 form a grid that separate fins 25. Fins 25 may form an array in these embodiments.

FIG. 4a illustrates the heat dissipating paths 32 (including 32A and 32B) represented by arrows. From die stacks 10/12, there are two major heat dissipating paths 32A and 32B. The heat generated in die portion 12B may be dissipated to heat dissipating ring 20 through heat dissipating paths 32A. The heat generated in die 12A and dies 10 may be dissipated to heat sink 24 through heat dissipating paths 32B.

In the embodiments in FIG. 4a, the heat in die 12A and dies 10 is dissipated to the overlying heat sink 24 through a single TIM, which is TIM 16A. Hence, the heat dissipation efficiency is high. Accordingly, the efficiency of the heat dissipation in the embodiments of the present disclosure is better than packages with conformal metal lids, shown in FIG. 4b, in which the die stacks and the respective overlying heat sinks have two or more TIMs therebetween which increase the thermal resistance to dissipating heat through dies 10.

The heat in die 12 has two heat dissipation paths, 32A and 32B. Since die 12 may be a logic die that consumes higher power, the heat generated by die 12, if all dissipated through dies 10 (which may be memory dies), will adversely affect the performance and reliability of dies 10. In the embodiments of the present disclosure, most of the heat generated in die portion 12B, which can be very high, does not go through dies 10 and thus significantly reduces the impact on dies 10 as a whole by the heat generated in die 12.

FIGS. 5A and 5B illustrate some exemplary floor plans of dies 12 and 10, respectively, the layout and dimension can affect the customization of heat sink 24 and heat dissipating ring 20. For example, in FIG. 5A, die 12 includes high-power-consuming circuits 34 and low-power-consuming circuits 36 consuming less power than high-power-consuming circuits 34. The high-power-consuming circuits 34 may be Serializer/Deserializer (Serdes) or GPU core or CPU core or cache or other advanced functional logic circuits, and the low-power-consuming circuits may be controllers in some embodiments. The high-power-consuming circuits 34 consume more power, and hence generate more heat, than low-power-consuming circuits 36. In accordance with some embodiments, high-power-consuming circuits 34 are at least partially, and possibly in entirety, allocated in portions 12B of die 12, which portions 12B are not overlapped by dies 10, as shown in FIG. 4a. On the other hand, the low-power-consuming circuits 36 are at least partially, and possibly entirely, allocated in portion 12A of die 12, which portion 12A is overlapped by dies 10, as shown in FIG. 4. FIG. 5B schematically illustrates an exemplary floor plan of die 10, which is a memory die in these embodiments. Memory die 10 may include a plurality of memory storage banks 38 distributed throughout die 10.

As shown in FIG. 4a, by overlapping heat dissipating ring 20 with die portions 12B that have high-power-consuming circuits, the heat generated in the high-power-consuming circuits may be dissipated to heat dissipating ring 20 directly without going through dies 10. The heat dissipating efficiency is thus improved.

Figure 8:
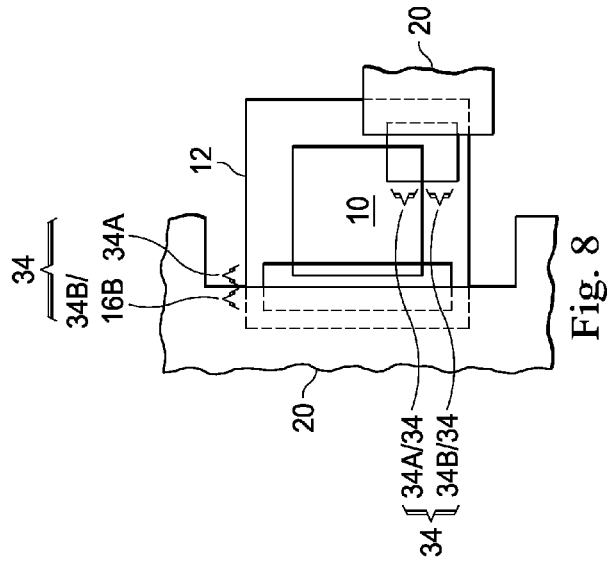
FIGS. 6, 7, and 8 illustrate some exemplary allocation schemes of high-power-consuming circuits and the respective heat dissipating rings.
Figure 6:
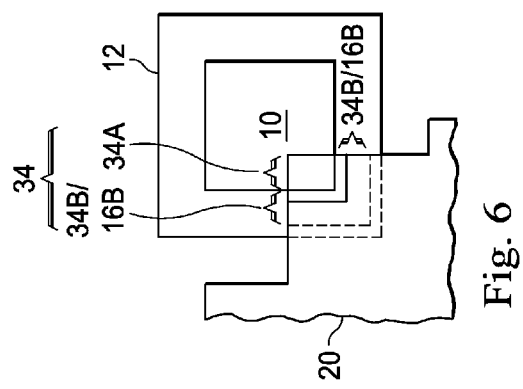
Figure 7:
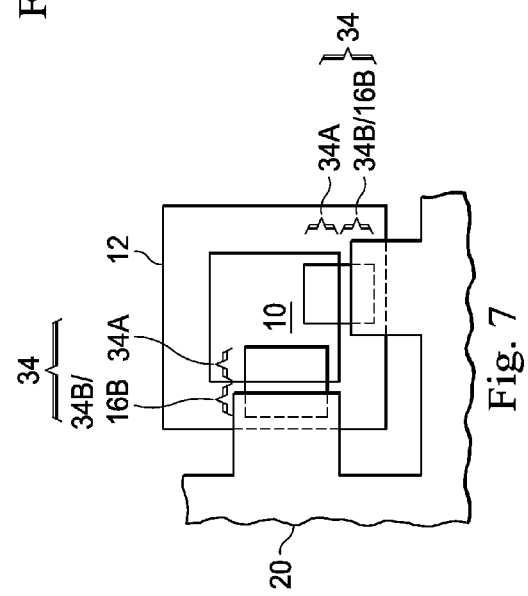

FIGS. 6, 7, and 8 illustrate some examples wherein the high-power-consuming circuits 34 are distributed to different parts of die 12, and the respective schemes for designing heat dissipating ring 20. Each of FIGS. 6, 7, and 8 illustrates a top view of dies 10, die 12, and a portion of heat dissipating ring 20. Although heat dissipating ring 20 may form a ring, for clarity, only the portion of heat dissipating ring 20 close to high-power-consuming circuits 34 (such as CPU core, GPU core, or other advanced functional logic) are illustrated, while other parts are not shown. Referring to FIG. 6, high-power-consuming circuit 34 is distributed at the left bottom corner of the illustrated die 12, wherein portion 34A of high-power-consuming circuit 34 is overlapped by dies 10 (through TIM 16B, refer to FIG. 4a), and portion 34B of high-power-consuming circuit 34 is not overlapped by dies 10. Heat dissipating ring 20 includes an arm extend to overlap portion 34B of high-power-consuming circuit 34. It is to be appreciated that although FIGS. 6, 7, and 8 illustrate that heat dissipation ring 20 extends to overlap high-power-consuming circuits 34 of die 12, heat dissipation ring 20 may also extend to overlap low-power-consuming circuits 36 (FIG. 5A) of die 12, and the overlapped portions of heat dissipation ring 20 and die 12 forms a ring.

FIG. 7 illustrates the top view of a package in accordance with alternative embodiments. In these embodiments, two high-power-consuming circuits 34 are allocated to close to two edges of die 12. Accordingly, heat dissipating ring 20 includes two arms, each extending to overlap one of high-power-consuming circuits 34. In FIG. 8, one high-power-consuming circuit 34 is close to the left edge of die 12, and the other high-power-consuming circuit 34 is close to the right bottom corner of die 12. Accordingly, heat dissipating ring 20 includes an extension bar overlapping the high-power-consuming circuit 34 at the left edge, and an extension arm overlapping the right bottom corner of die 12.

Figure 9:
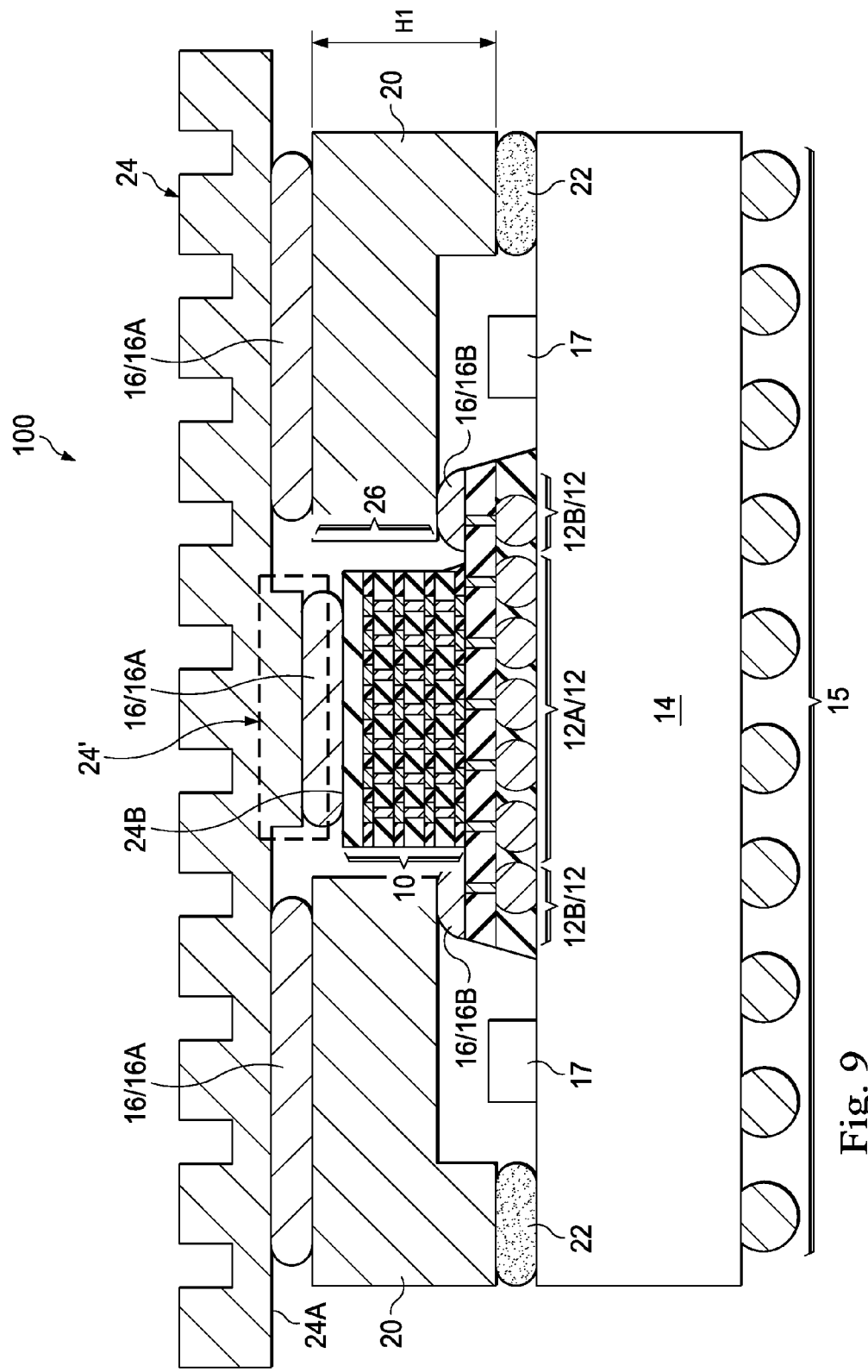
FIG. 9 illustrates a top view of a die stack encircled by a heat dissipating ring in accordance with some embodiments, wherein a heat sink comprises a protruding portion extends into a space encircled by a heat dissipating ring.

FIG. 9 illustrates the heat dissipation scheme in accordance with alternative embodiments. As shown in FIG. 9, heat sink 24 includes first bottom surface 24A, and second bottom surface 24B, which is also the bottom surface of protruding portion 24' of heat sink 24. Bottom surface 24B is lower than, and may be parallel to, bottom surface 24A. Protruding portion 24' may extend into space 26, which is encircled by heat dissipating ring 20. In these embodiments, bottom surface 24B is lower than the top surface of heat dissipating ring 20.

Through the design of protruding portion 24', and further through the adjustment of the thickness of protruding portion 24', the thickness H1 of heat dissipating ring 20 may be increased without requiring the thickness of TIM 16A to be increased accordingly. Hence, TIM 16A may be kept as a thin layer to improve the efficiency in the heat dissipation, regardless of the height difference between the top surface of dies 10 and the top surface of heating dissipating ring 20.

Figure 10:
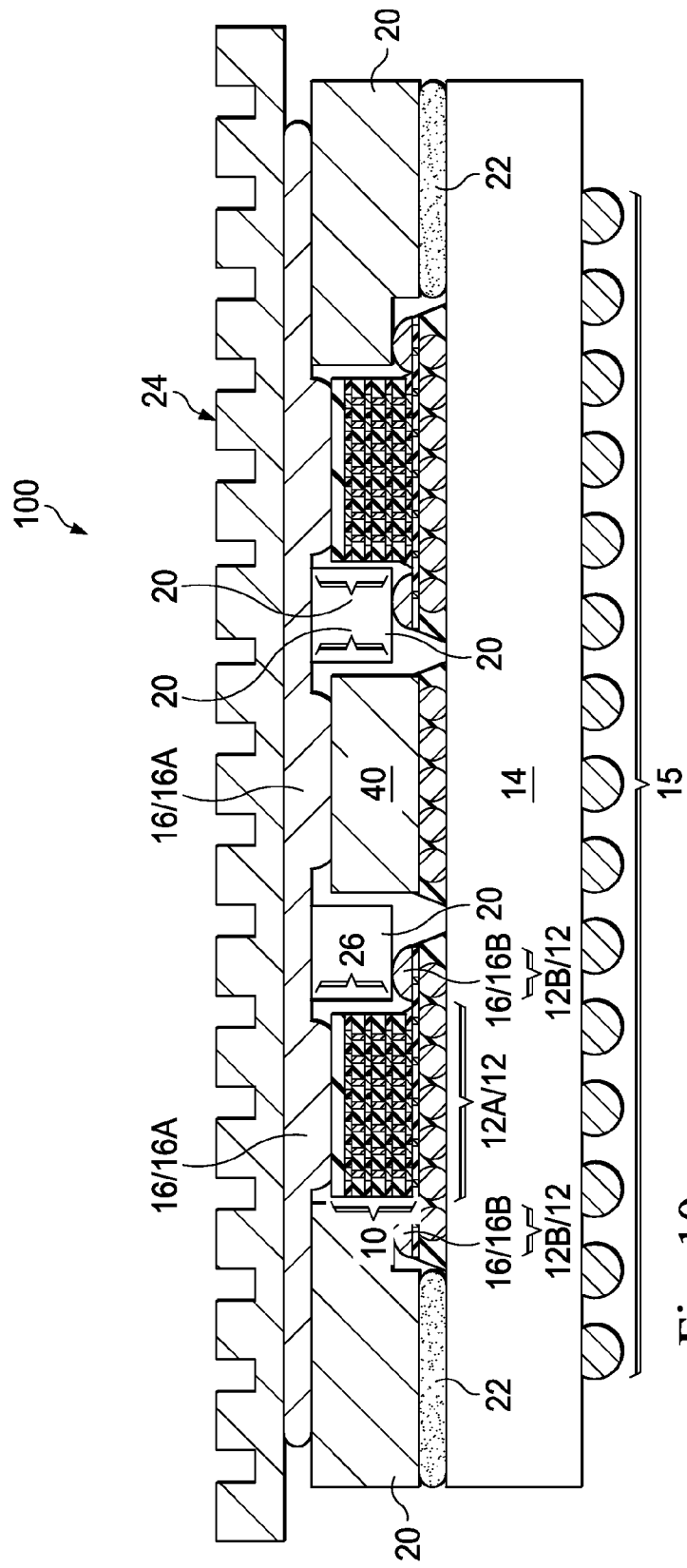
FIG. 10 illustrates a cross-sectional view of a plurality of die stacks bonded to a package component in accordance with some embodiments, wherein a heat dissipating ring includes a plurality of openings for disposing the plurality of die stacks.

FIG. 10 illustrates the heat dissipation scheme in accordance with yet alternative embodiments. The package in accordance with these embodiments include System-on-Chip (SoC) die 40 in addition to die stack 10/12. The top surface of SoC die 40 is attached to heat sink 24 through a portion of TIM 16A/16. In these embodiments, heat dissipating ring 20 includes a plurality of openings 26 therein, with each of openings 26 encircled by a portion of heat dissipating ring 20 that forms a ring. SoC die 40 and die stack 10/12 are disposed in openings 26 either partially or entirely. In these embodiments, the heat in dies 10 and SoC die 40 is dissipated to heat sink 24 through TIM portions 16A.

Figure 11A:
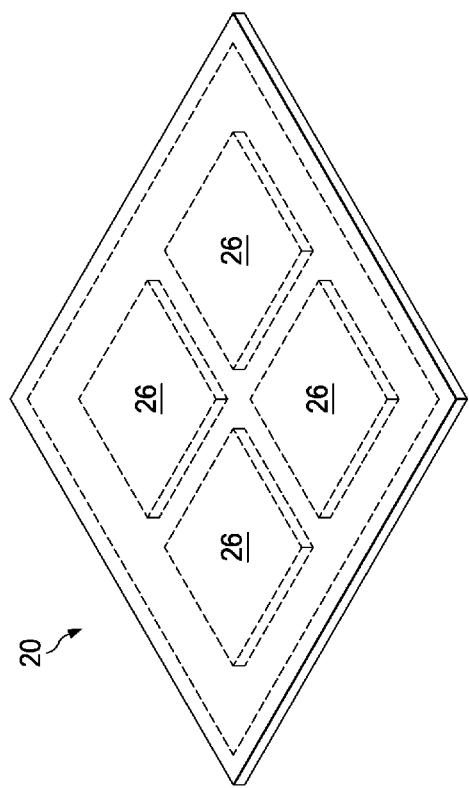
FIG. 11A illustrates a perspective view of a heat dissipating ring including a plurality of openings.
Figure 11B:
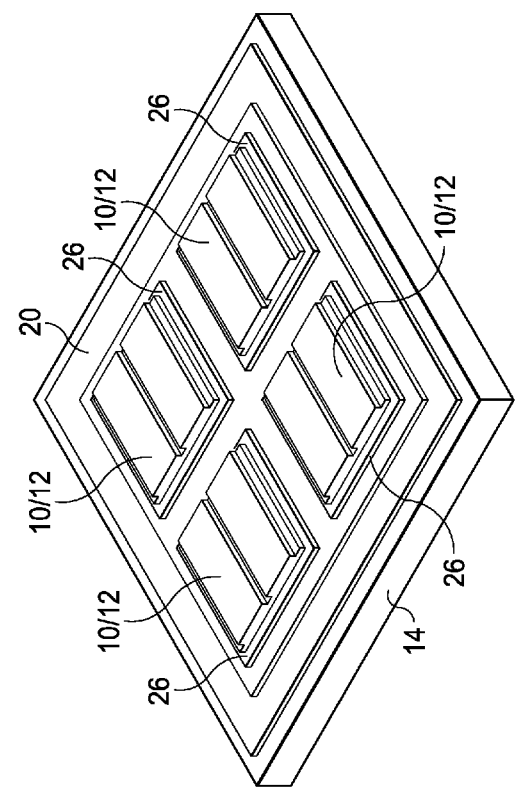

FIGS. 11A through 11D illustrate some packages in accordance with some embodiments, in which heat dissipating ring 20 includes a plurality of openings therein. In the illustrated examples (for example, FIG. 11B), there are four die stacks 10/12 disposed in four openings 26. FIG. 11A illustrates a perspective view of heat dissipating ring 20, which includes a plurality of through openings 26. FIG. 11B illustrates the bonding of heat dissipating ring 20 to package component 14, on which four dies or die stacks 10/12 are bonded. FIG. 11C illustrates a cross-sectional view of the respective package in FIG. 11B. FIG. 11D illustrates the perspective view of a portion of the package as shown in FIG. 11C.

Figure 12:
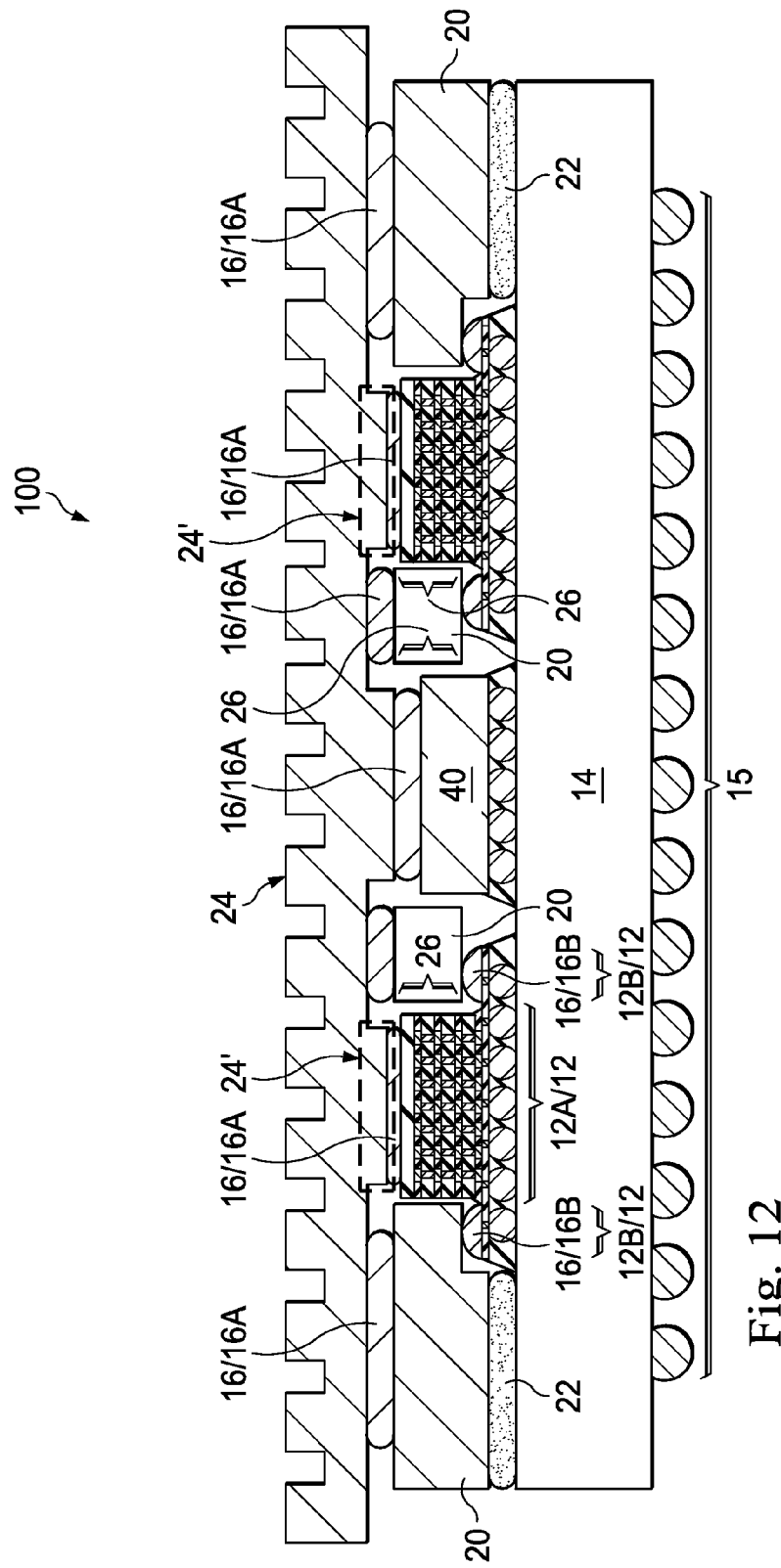
FIG. 12 illustrates a heat sink attached to a heat dissipating ring comprising a plurality of openings in accordance with some embodiments, wherein the heat sink comprises a plurality of protruding portions.

FIG. 12 illustrates the heat dissipation scheme in accordance with yet alternative embodiments. Package 100 in these embodiments is similar to the embodiments in FIG. 10, except the heat sink 24 in these embodiments includes a plurality of protruding portions 24' extending down, wherein the protruding portions 24' are aligned to the openings 26 in heat dissipating ring 20. The protruding portions 24' may also intend into openings 26 in some embodiments. These embodiments may be used when there is a height difference between heat dissipating ring 20 and die stacks 10/12 and die 40. Furthermore, the top surface of die stack 10/12 may be higher than, level with, or lower than the top surface of SoC die 40. Accordingly, the protruding portions 24' of heat sink 24 may have corresponding thicknesses adjusted, so that the plurality of TIM portions 16A over die stack 10/12 may have desirable thicknesses, which thicknesses may be adjusted to be small in order to improve the efficiency in heat dissipation.

Figure 13:
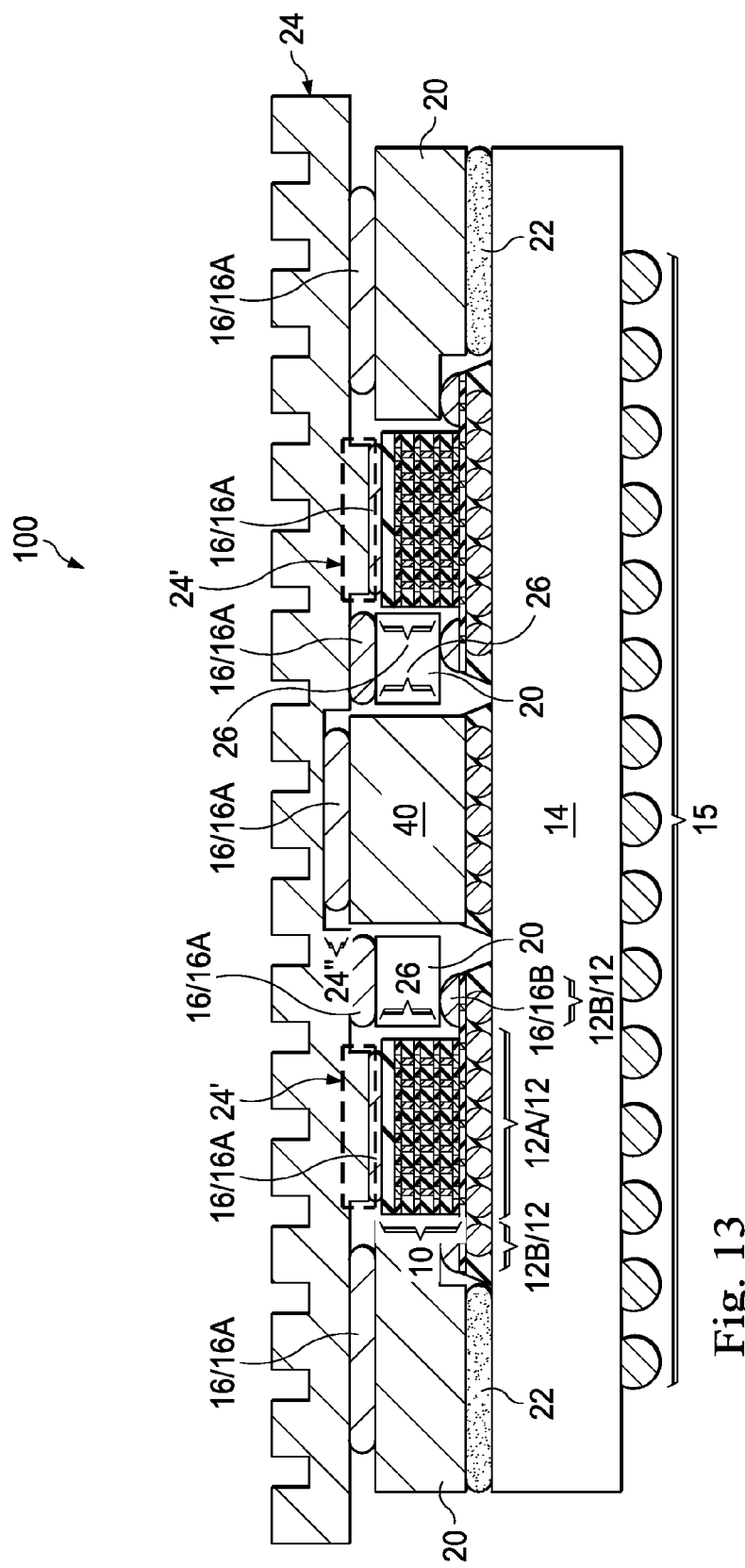
FIG. 13 illustrates a heat sink attached to a heat dissipating ring comprising a plurality of openings in accordance with some embodiments, wherein the heat sink comprises a plurality of protruding portions and a recess.

FIG. 13 illustrates the heat dissipation scheme in accordance with yet alternative embodiments. These embodiments differ from the embodiments in FIG. 12 in that heat sink 24 includes recess 24". In some exemplary embodiments, the top surface of SoC die 40 is higher than the top surface of die stack 10/12 and the top surface of heat dissipating ring 20. Hence, recess 24" is formed to accommodate the height of SoC die 40. SoC die 40 may, or may not, extend into recess 24". In alternative embodiments, the top surface of die stack 10/12 may be higher than the top surface of heat dissipating ring 20, and hence die stack 10/12 may be aligned to, and may extend into, the recess in heat sink 24.

In the embodiments of the present disclosure, the height differences of the SoC die 40, die stacks 10/12, and heat dissipating ring 20 may be compensated for through the recesses (similar to recesses 24" in FIG. 13) and protruding portions 24'. Through the embodiments in FIGS. 9, 10, 12, and 13, a same heat sink may be used to attach to different components such as die stacks 10/12, SoC die 40, and heating dissipating ring 20 that have different heights. The bottom surface of the heat sink may have different levels so that the heat dissipating performance of the respective package is high (due to that the TIMs are thin), and the manufacturing cost is low.

The embodiments of the present disclosure have some advantageous features. By using both heat dissipating ring 20 and heat sink 24, the heat in packages may be dissipated more efficiently. A simulation is performed to simulate the temperature distribution in the packages that include stacked dies. In the simulation, a first sample having the structure as shown in FIG. 4a is compared to a second sample as shown in FIG. 4b. The second sample, shown in FIG. 4b, is similar to what is shown in FIG. 4a except that a single-piece conformal metal lid 21 replaces heat dissipating ring 20 in FIG. 4a. The conformal lid is over and encircling a die stack, with a first TIM disposed between the die stack and the conformal lid. In the second sample (as shown in FIG. 4b), the heat sink is over and attached to the conformal metal lid through a second TIM. The simulation results revealed that when the configuration in FIGS. 5A and 5B are adopted in the first and the second samples, the operation temperature of the high-power-circuits portion of the logic die (corresponding to die 12 in FIG. 4a) is 92.4° C., which is lower than the operation temperature (96.1° C.) of the corresponding logic die in the second sample (corresponding to die 12 in FIG. 4b). Furthermore, the operation temperature of the bottom die in die stacks 10 is reduced from 93.5° C. in the second sample (FIG. 4b) to 88.4° C. in the first sample (FIG. 4a). Therefore, by adopting the heat dissipating schemes of the embodiments of the present disclosure, the operation temperatures of the packages are lowered.

In addition, in the embodiments of the present disclosure, a heat sink is attached directly to die stacks and/or SoC die through TIMs. Accordingly, with the heat sink 24 and the heat dissipating ring 20 being separate pieces, which are less rigid than a single-piece component, for example, the conformal lid in FIG. 4b, the stress applied to the dies is reduced. Simulation results indicate that by adopting the embodiments of the present disclosure (as shown in FIG. 4a), the stress applied to the low-k dielectric layers of the logic die (such as die 12 in FIG. 2) is about 60 Mpa, which is significantly smaller than the stress applied to the low-k dielectric layers of the logic die, over which a single-piece conformal lid (as shown in FIG. 4b) is used.

In accordance with some embodiments, a package includes a first die and a second die underlying the first die and in a same first die stack as the first die. The second die includes a first portion overlapped by the first die, and a second portion extending beyond edges of the first die. A first TIM is overlying and contacting a top surface of the first die. A heat sink has a first bottom surface over and contacting the first TIM. A second TIM is overlying and contacting the second portion of the second die. A heat dissipating ring is overlying and contacting the second TIM.

In accordance with other embodiments, a package includes a die stack including a plurality of dies, and a die underlying and bonded to the die stack. The die includes a first portion overlapped by the die stack, and a second portion. A first TIM is overlying and contacting a top surface of the die stack. A second TIM is overlying and contacting the second portion of the die. A heat sink has a plurality of fins at a top surface of the heat sink. The heat sink includes a first portion over and contacting the first TIM, and a second portion. A heat dissipating ring has an extension portion, wherein the extension portion is overlapped by the second portion of the heat sink, and wherein the extension portion of the heat dissipating ring further includes a first bottom surface contacting the second TIM.

In accordance with yet other embodiments, a package includes a die stack including a plurality of dies, and a die underlying and bonded to the die stack. The die includes a first portion overlapped by the die stack, and a second portion extending beyond edges of the die stack. A first TIM is overlying and contacting a top surface of the die stack. A second TIM is overlying and contacting the second portion of the die. A heat sink includes a first bottom surface contacting the first TIM, and a second bottom surface overlapping the second TIM. A heat dissipating ring includes a portion overlapping and contacting the second TIM, wherein the portion of the heat dissipating ring encircles the die stack.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
   a first die;
   a second die underlying the first die and in a same first die stack as the first die, wherein the second die comprises:
   a first portion overlapped by the first die; and
   a second portion extending beyond edges of the first die;
   a first Thermal Interface Material (TIM) over and contacting a top surface of the first die;
   a heat sink comprising a first bottom surface over and contacting the first TIM;
   a second TIM over and contacting the second portion of the second die; and
   a heat dissipating ring over and contacting the second TIM.

2. The package of claim 1, wherein the heat sink comprises a plurality of fins at a top surface of the heat sink, with a plurality trenches between the plurality of fins.

3. The package of claim 1, wherein an entirety of bottom surfaces of the heat sink is planar.

4. The package of claim 1, wherein the heat sink comprises:
   a first bottom surface overlapping the heat dissipating ring; and
   a second bottom surface below the first bottom surface.

5. The package of claim 1, wherein the heat sink comprises a recess extending from a bottom surface of the heat sink to an intermediate level of the heat sink.

6. The package of claim 1, wherein the second TIM forms a ring encircling the second die.

7. The package of claim 1, wherein the first die stack further comprises a third die between the first die and the second die.

8. The package of claim 1 further comprising:
   a third die;
   a fourth die underlying the third die and in a same second die stack as the third die, wherein the fourth die comprises:
   a first portion overlapped by the third die; and
   a second portion not overlapped by the third die;
   a third TIM over and contacting a top surface of the third die, wherein a top surface of the third TIM is in contact with a second bottom surface of the heat sink; and
   a fourth TIM over and contacting the second portion of the fourth die, wherein the fourth TIM comprises a top surface in contact with the heat dissipating ring.

9. A package comprising:
   a die stack comprising a plurality of dies;
   a die underlying and bonded to the die stack, wherein the die comprises:
   a first portion overlapped by the die stack; and
   a second portion;
   a first Thermal Interface Material (TIM) over and contacting a top surface of the die stack;
   a second TIM over and contacting the second portion of the die;
   a heat sink comprising a plurality of fins at a top surface of the heat sink, wherein the heat sink comprises:
   a first portion over and contacting the first TIM; and
   a second portion; and
   a heat dissipating ring comprising an extension portion, wherein the extension portion is overlapped by the second portion of the heat sink, and wherein the extension portion of the heat dissipating ring further comprises a first bottom surface contacting the second TIM.

10. The package of claim 9, wherein the heat sink and the heat dissipating ring are discrete components physically separated from each other.

11. The package of claim 9 further comprising:
    a package substrate underlying and bonded to the die;
    an adhesive having a thermal conductivity lower than thermal conductivities of the first TIM and the second TIM, wherein the adhesive comprises:
    a top surface contacting a second bottom surface of the extension portion of the heat dissipating ring; and
    a bottom surface contacting the package substrate.

12. The package of claim 9, wherein the second TIM forms a ring encircling the die stack.

13. The package of claim 9, wherein an entirety of all bottom surfaces of the heat sink is planar.

14. The package of claim 9, wherein the heat sink comprises:
    a first bottom surface overlapping the heat dissipating ring; and
    a second bottom surface below the first bottom surface, wherein the second bottom surface is a bottom surface of a protruding portion of the heat sink.

15. The package of claim 9, wherein the heat sink comprises a recess extending from a bottom surface of the heat sink to an intermediate level of the heat sink.

16. A package comprising:
    a die stack comprising a plurality of dies;
    a die underlying and bonded to the die stack, wherein the die comprises:
    a first portion overlapped by the die stack; and
    a second portion extending beyond edges of the die stack;
    a first Thermal Interface Material (TIM) over and contacting a top surface of the die stack;

a second TIM over and contacting the second portion of the die;
a heat sink comprising:
  a first bottom surface contacting the first TIM; and
  a second bottom surface overlapping the second TIM; and
a heat dissipating ring comprising a first portion overlapping and contacting the second TIM, wherein the first portion of the heat dissipating ring encircles the die stack.

17. The package of claim 16 further comprising:
a package substrate, wherein the die is over and bonded to the package substrate;
a System-on-Chip (SoC) die over and bonded to the package substrate; and
a third TIM between, and contacting, the SoC die and the heat sink.

18. The package of claim 16, wherein the heat dissipating ring further comprises a second portion encircling the first portion, wherein the second portion comprises a bottom surface, and wherein the package further comprises an adhesive comprising a top surface contacting a bottom surface of the second portion of the heating dissipating ring.

19. The package of claim 18 further comprising a third TIM between and contacting the heat sink and the second portion of the heat dissipating ring.

20. The package of claim 16, wherein the heat sink comprises a recess extending from a bottom surface to an intermediate level of the heat sink.

\* \* \* \* \*